(12) United States Patent
Xie et al.

(10) Patent No.: US 8,753,970 B2
(45) Date of Patent: Jun. 17, 2014

(54) METHODS OF FORMING SEMICONDUCTOR DEVICES WITH SELF-ALIGNED CONTACTS AND THE RESULTING DEVICES

(75) Inventors: Ruilong Xie, Niskayuna, NY (US); Ponoth Shom, Gaithersburg, MD (US); Xiuyu Cai, Albany, NY (US); Balasubramanian Pranatharthiharan, Watervliet, NY (US); Robert J. Miller, Yorktown Heights, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 13 days.

(21) Appl. No.: 13/611,652

(22) Filed: Sep. 12, 2012

(65) Prior Publication Data

US 2014/0070285 A1     Mar. 13, 2014

(51) Int. Cl.
    *H01L 21/3205*     (2006.01)
    *H01L 21/4763*     (2006.01)
    *H01L 21/28*     (2006.01)

(52) U.S. Cl.
    USPC .......................................... 438/595; 257/387

(58) Field of Classification Search
    CPC .................. H01L 29/66545; H01L 21/82345; H01L 29/66628

USPC .......................................... 438/183, 926, 595
See application file for complete search history.

(56) References Cited

U.S. PATENT DOCUMENTS

| | | | | |
|---|---|---|---|---|
| 7,138,308 | B2 * | 11/2006 | Cheng et al. | 438/197 |
| 8,436,404 | B2 * | 5/2013 | Bohr et al. | 257/288 |
| 8,524,592 | B1 * | 9/2013 | Xie et al. | 438/595 |
| 2006/0008992 | A1 * | 1/2006 | Shukuri | 438/264 |

\* cited by examiner

*Primary Examiner* — Matthew Landau
*Assistant Examiner* — Damon Hillman
(74) *Attorney, Agent, or Firm* — Amerson Law Firm, PLLC

(57) ABSTRACT

One method includes forming a sacrificial gate structure above a substrate, forming a first sidewall spacer adjacent a sacrificial gate electrode, removing a portion of the first sidewall spacer to expose a portion of the sidewalls of the sacrificial gate electrode, and forming a liner layer on the exposed sidewalls of the sacrificial gate electrode and above a residual portion of the first sidewall spacer. The method further includes forming a first layer of insulating material above the liner layer, forming a second sidewall spacer above the first layer of insulating material and adjacent the liner layer, performing an etching process to remove the second sidewall spacer and sacrificial gate cap layer to expose an upper surface of the sacrificial gate electrode, removing the sacrificial gate electrode to define a gate cavity at least partially defined laterally by the liner layer, and forming a replacement gate structure in the cavity.

13 Claims, 12 Drawing Sheets

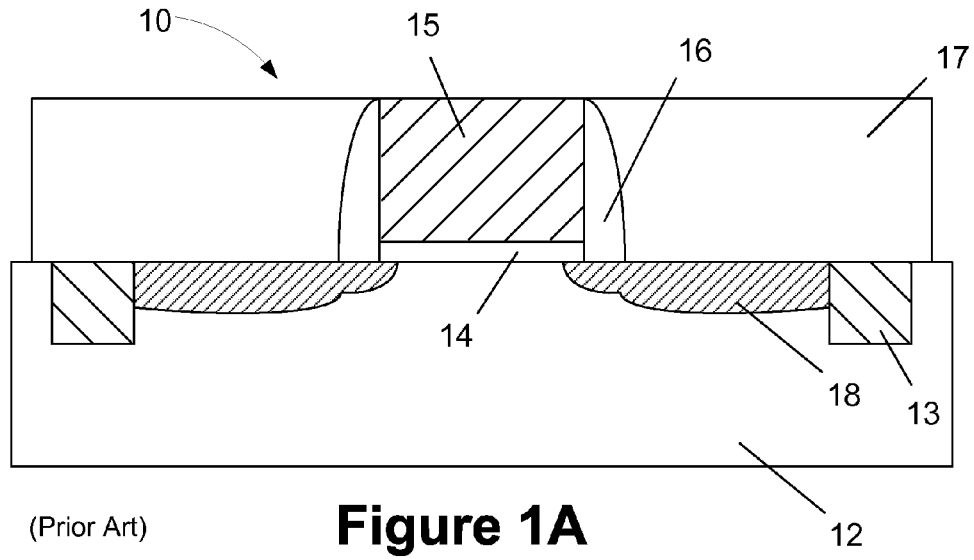
(Prior Art) Figure 1A
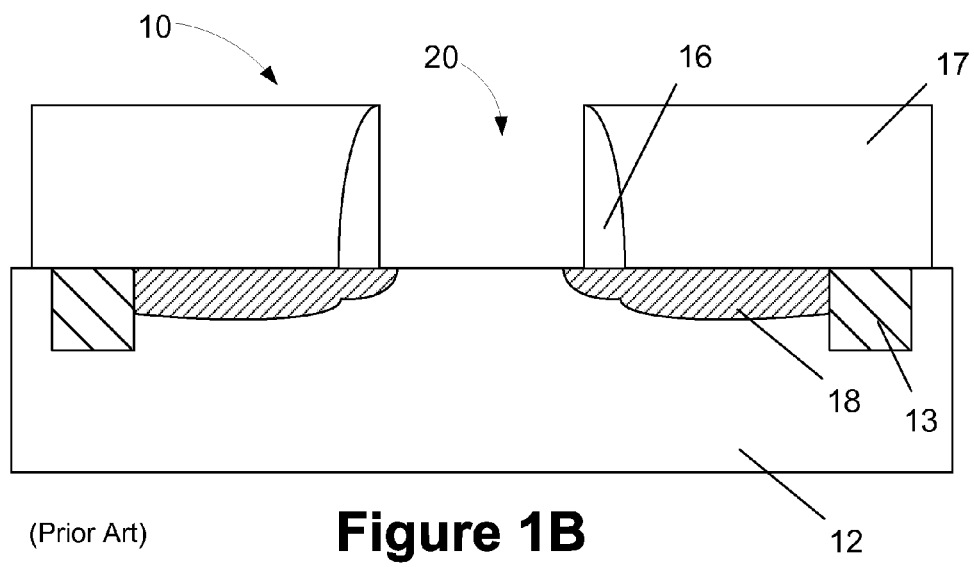
(Prior Art) Figure 1B

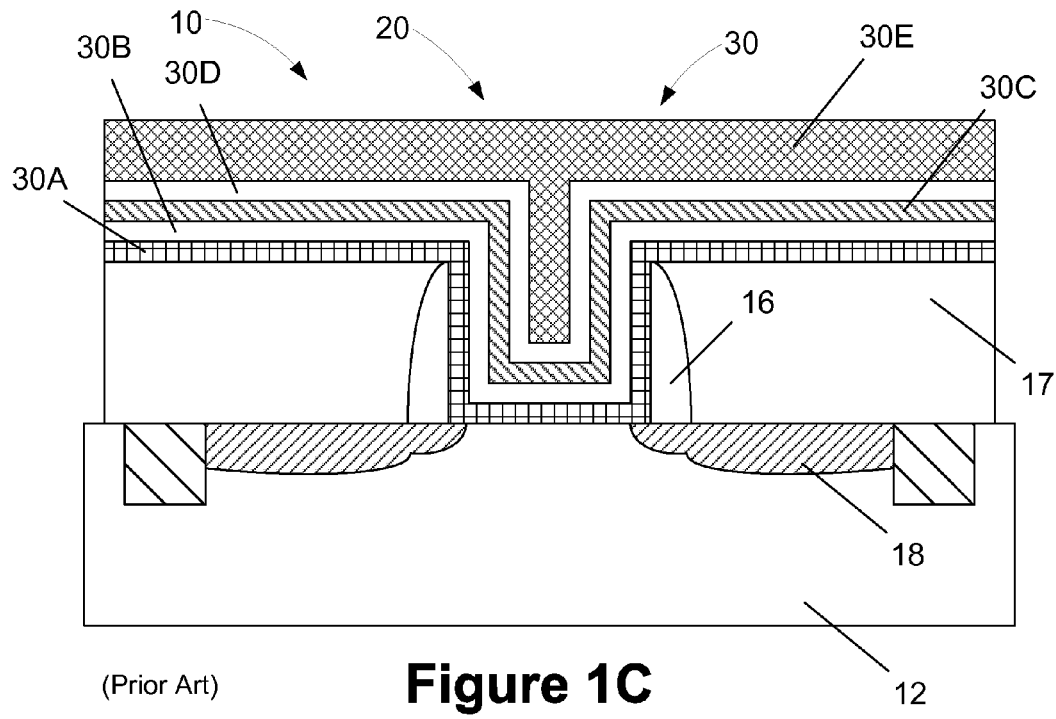
(Prior Art) Figure 1C
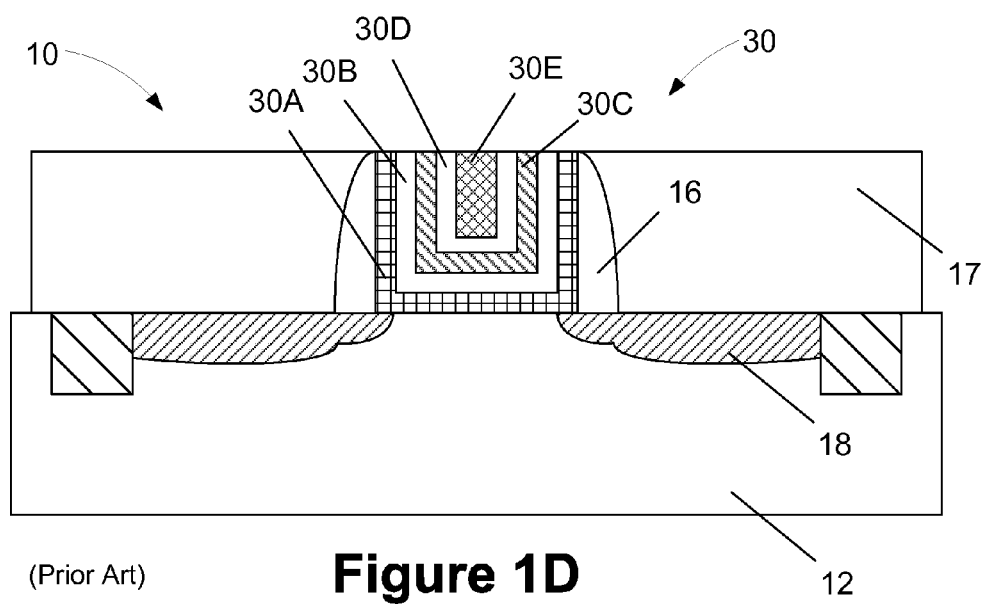
(Prior Art) Figure 1D

US 8,753,970 B2

METHODS OF FORMING SEMICONDUCTOR DEVICES WITH SELF-ALIGNED CONTACTS AND THE RESULTING DEVICES

BACKGROUND OF THE INVENTION

1. Field of the Invention

Generally, the present disclosure relates to the manufacture of sophisticated semiconductor devices, and, more specifically, to various methods of forming semiconductor devices with self-aligned contacts and various semiconductor devices having such features.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines performance of such integrated circuits. During the fabrication of complex integrated circuits using, for instance, MOS technology, millions of transistors, e.g., NFET transistors and/or PFET transistors, are formed on a substrate including a crystalline semiconductor layer. A field effect transistor, whether an NFET or a PFET device, is a planar device that typically includes a source region, a drain region, a channel region that is positioned between the source region and the drain region, a gate insulation layer and a gate electrode positioned above the gate insulation layer over the channel region. By applying an appropriate voltage to the gate electrode, the channel region becomes conductive and current is allowed to flow from the source region to the drain region.

For many early device technology generations, the gate structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NFET devices and P-type dopants for PFET devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PFET transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. A masking layer that is typically used in such etching processes is not depicted for purposes of clarity. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. The materials used for such replacement gate structures 30 may vary depending upon the particular application. Even in cases where the sacrificial gate insulation layer 14 is intentionally removed, there will typically be a very thin native oxide layer (not shown) that forms on the substrate 12 within the gate cavity 20. In one illustrative example, the replacement gate structure 30 is comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C (e.g., a layer of tantalum nitride with a thickness of about 1-2 nm), a third metal layer 30D (e.g., a layer of titanium nitride with a thickness of about 5 nm) and a bulk metal layer 30E, such as aluminum. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30.

As device dimensions have decreased and packing densities have increased, parasitic capacitance is becoming more important as a factor to consider to improve the operating speed of transistor devices. Typically, as noted above, the gate structure of a transistor will include at least one sidewall spacer positioned adjacent the gate structure. Typically, the sidewall spacers are made of silicon nitride and they are normally formed very soon after the sacrificial gate structure is formed for devices manufactured using the replacement gate technique. For replacement gate structures, two of the primary purposes of the silicon nitride spacers are to define the gate cavity in the replacement gate manufacturing process and to protect the final replacement gate structure.

FIG. 1E depicts an illustrative prior art semiconductor device 10A comprised of first and second transistors 40A, 40B formed in and above the substrate 12. Each of the transistors 40A, 40B is comprised of a schematically depicted replacement gate structure 42 (which includes the gate insulation layer and gate electrode), a gate cap layer 44 and sidewall spacers 46. Also depicted are illustrative raised source/drain regions 48 and a plurality of self-aligned contacts 50 that are positioned in a layer of insulating material 49, e.g., silicon dioxide. The self-aligned contacts 50 are conductively coupled to the raised source/drain regions 48. The spacers 46 are typically made of silicon nitride which has a relatively high k-value of, e.g., about 7-8. As a result of the structure of the transistors, a gate-to-contact capacitor is generally defined in the regions 55, where the gate electrode of the replacement gate structure functions as one of the conductive plates of the capacitor and the self-aligned contact 50 functions as the other conductive plate of the capacitor. The presence of the silicon nitride spacer material (with a relatively high k-value) tends to increase the parasitic capacitance between the conductive gate electrode and self-aligned contacts. This problem has become even more problematic as packing densities have increased which causes the gate structures of adjacent transistors to be positioned ever closer to one another. Unfortunately, the gate-to-contact capacitor tends to slow down the switching speed of the transistor as this capacitor must be charged and discharged each time the transistor is turned on-off.

The use of alternative materials for the sidewall spacers, such as materials having k-values less than about 6 or so, has been problematic. Most of such low-k materials are based upon carbon or boron doped silicon nitride. The low-k material, when used as a traditional spacer material, is subjected to a reactive ion etching (RIE) process to define the spacer from such a low-k material. The RIE process tends to deplete the carbon and boron, thereby effectively increasing the k-value of the low-k material. Such low-k materials may also tend to be weaker mechanically than silicon nitride, which makes them less capable of standing up to the rigors of processing after they are formed. Moreover, such spacers are typically subjected to relatively high temperature source/drain anneal processes, which also tends to deplete the carbon and boron from such low-k materials.

The present disclosure is directed to various methods of forming semiconductor devices with self-aligned contacts and low-k spacers and various semiconductor devices incorporating such low-k spacers that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices with self-aligned contacts and perhaps low-k spacers and various semiconductor devices having such features. One illustrative method disclosed herein includes forming a sacrificial gate structure above a substrate, forming at least one first sacrificial sidewall spacer adjacent a sacrificial gate electrode, removing at least a portion of the first sacrificial sidewall spacer to thereby expose at least a portion of the sidewalls of the sacrificial gate electrode and forming a liner layer on the exposed sidewalls of the sacrificial gate electrode and above a residual portion of the first sacrificial sidewall spacer. In this example, the method includes the additional steps of forming a first layer of insulating material above the liner layer, forming a second sacrificial sidewall spacer above the first layer of insulating material and adjacent the liner layer, forming a second layer of insulating material adjacent the second sacrificial sidewall spacer, performing at least one etching process to remove the second sacrificial sidewall spacer and the sacrificial gate cap layer to thereby define an opening in the second layer of insulating material that exposes an upper surface of the sacrificial gate electrode, removing at least the sacrificial gate electrode to thereby define a gate cavity that is at least partially defined laterally by the liner layer, and forming a replacement gate structure in the gate cavity.

One example of a novel device disclosed herein includes a gate structure comprised of a gate insulation layer and a gate electrode, wherein the gate insulation layer has two upstanding portions that are substantially vertically oriented relative to an upper surface of a semiconducting substrate, a gate cap layer positioned above the gate electrode, a sidewall spacer positioned adjacent the gate cap layer, a liner layer of silicon nitride or silicon oxynitride positioned on at least a portion of each of the two upstanding portions of the gate insulation layer, and an insulating material, at least a portion of which is positioned on the liner layer and under the sidewall spacer

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict a semiconductor device with self-aligned contacts where the gate structures of the transistors were formed using a so-called "replacement gate" technique.

Figure 1E:
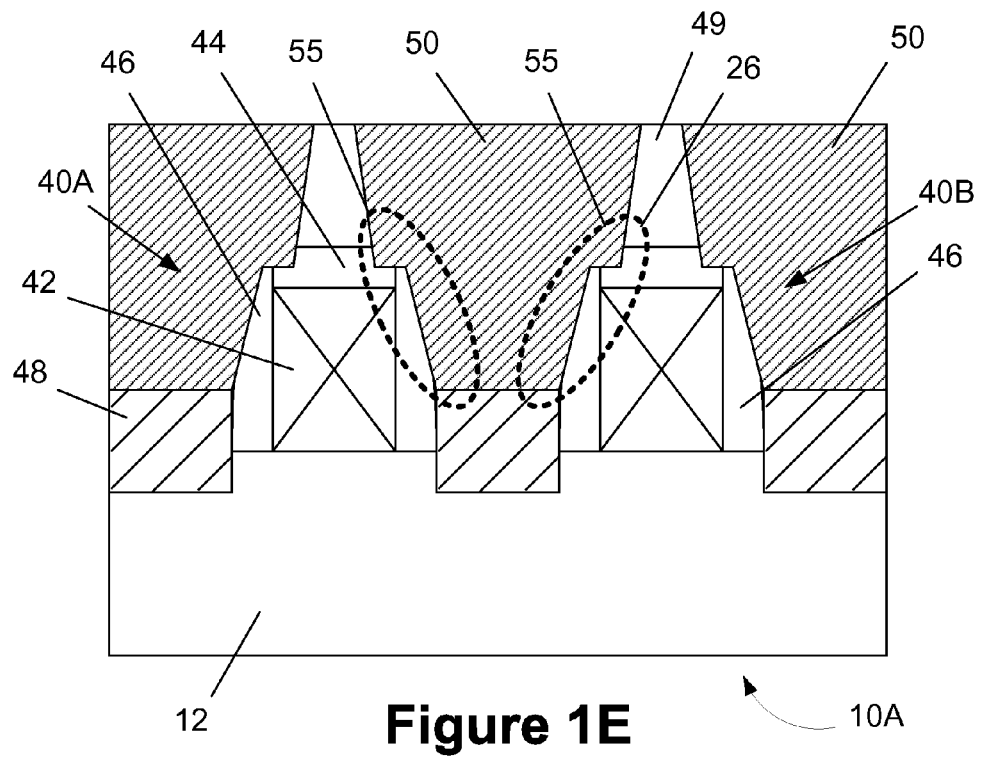

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming semiconductor devices with self-aligned contacts that may also include low-k spacers, and various semiconductor devices having one or both of such features. As will be readily apparent to those skilled in the art upon a complete reading of the present application, the methods disclosed herein may be employed with a variety of different technologies, e.g., NMOS, PMOS, CMOS, etc., and in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, the inventions disclosed herein may be employed in forming planar transistor devices (NFET or PFET devices), as well as so-called 3-D devices, such as FinFETs. For purposes of disclosure, reference will be made to an illustrative process flow for forming a planar transistor device. However, the inventions disclosed herein should not be considered to be limited to such an illustrative example.

Figure 2A:
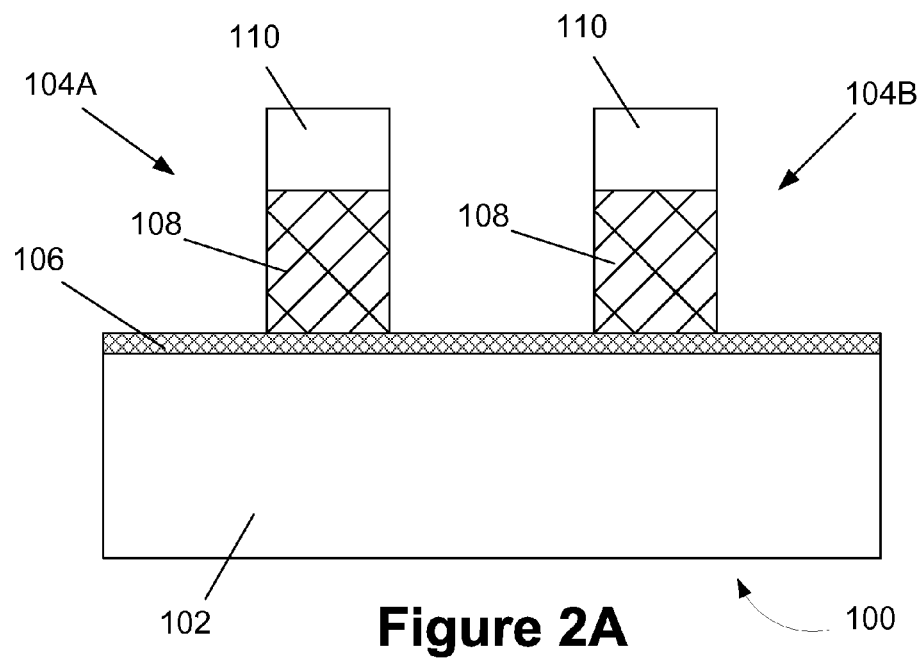
FIGS. 2A-2R depict various illustrative methods disclosed herein for forming semiconductor devices with self-aligned contacts and perhaps low-k spacers, as well as a plurality of illustrative examples of a device having such feature(s).

FIG. 2A is a simplified view of an illustrative semiconductor device 100 at an early stage of manufacturing. Illustrative transistors 104A, 104B will be formed in and above the semiconducting substrate 102. So as not to obscure the inventions disclosed herein, isolation regions that are formed in the substrate to define active regions where the transistors 104A, 104B will be formed are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconducting substrate" should be understood to cover all semiconducting materials and all forms of such materials.

In the example disclosed herein, the transistors 104A, 104B will be formed using a replacement gate technique. Accordingly, with continuing reference to FIG. 2A, the process begins with the formation of a sacrificial gate insulation layer 106 and schematically depicted sacrificial gate electrodes 108 with a sacrificial cap layer 110 formed thereabove. Such structures and layers may be formed using a variety of different materials and by performing a variety of known techniques. For example, the sacrificial gate insulation layer 106 may be comprised of silicon dioxide, the sacrificial gate electrode layer 108 may be comprised of polysilicon or amorphous silicon and the cap layer 110 may be comprised of silicon nitride. The sacrificial gate insulation layer 106, sacrificial gate electrode layer 108 and the cap layer 110 may be of any desired thickness or configuration. Moreover, the mask layer 110 could be comprised of multiple layers of material, such as, for example, a combination of a silicon nitride layer and a layer of silicon dioxide. Thus, the particular form and composition of the mask layer 110 and the manner in which it is made should not be considered a limitation of the present invention. Of course, those skilled in the art will recognize that there are other features of the transistors 104A, 104B that are not depicted in the drawings so as not to obscure the present invention. For example, so-called halo implant regions and various layers or regions of silicon/germanium that are typically found in high performance PFET transistors are not depicted in the drawings. The layers of material depicted in FIG. 2A may be formed by any of a variety of different known techniques, e.g., a chemical vapor deposition (CVD) process, an atomic layer deposition (ALD) process, a thermal growth process, etc. One or more patterning and etching processes are performed to define the sacrificial gate electrode 108 and the gate cap layer 110. Typically, the cap layer 110 is patterned using known photolithography and etching techniques to thereby define a patterned cap layer. Alternatively, the cap layer 110 may be patterned using known sidewall image transfer techniques. Thereafter, one or more etching processes are performed through the patterned cap layer 110 to remove exposed portions of the sacrificial gate electrode material layer to thereby define the depicted sacrificial gate electrodes 108.

Figure 2B:
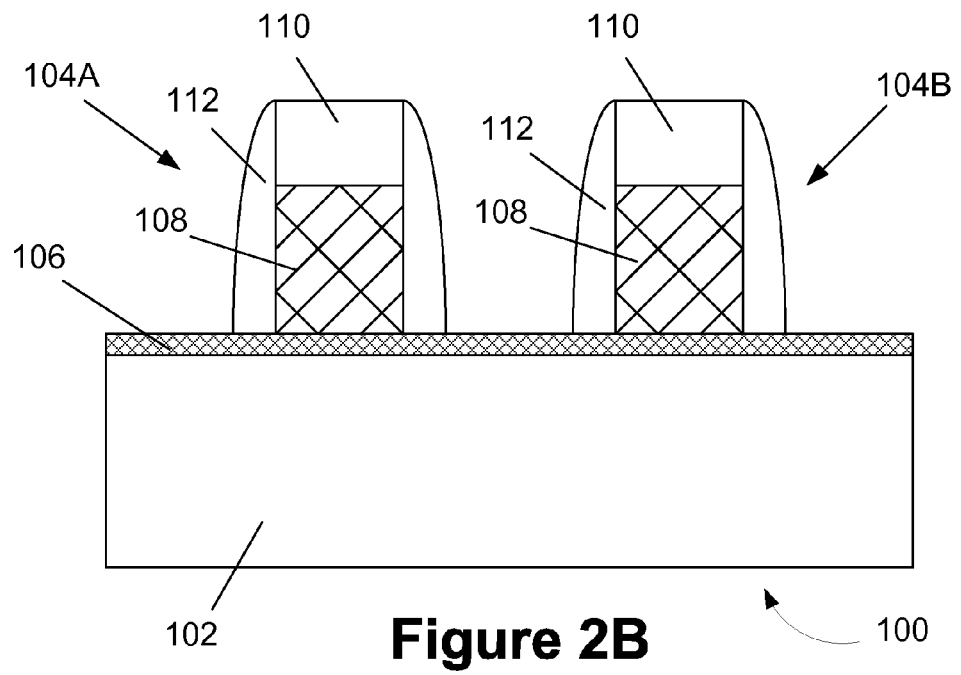

FIG. 2B depicts the device 100 after a first sacrificial sidewall spacer 112 was formed adjacent the sacrificial gate electrode 108. The first sacrificial sidewall spacer 112 may be formed by depositing a layer of spacer material and thereafter performing an anisotropic etching process. The first sacrificial sidewall spacer 112 may be comprised of a variety of different materials, e.g., silicon nitride, silicon oxynitride, etc. The base thickness of the first sacrificial sidewall spacer 112 may vary depending upon the particular application. In one illustrative embodiment, the first sacrificial sidewall spacer 112 may have a thickness at its base of about 7-15 nm. As described more fully below, even though the spacer 112 is referred to as the "first sacrificial sidewall spacer," a portion of the spacer 112 is not sacrificial in nature and a residual portion of the spacer 112 will be used in the final device.

Figure 2C:
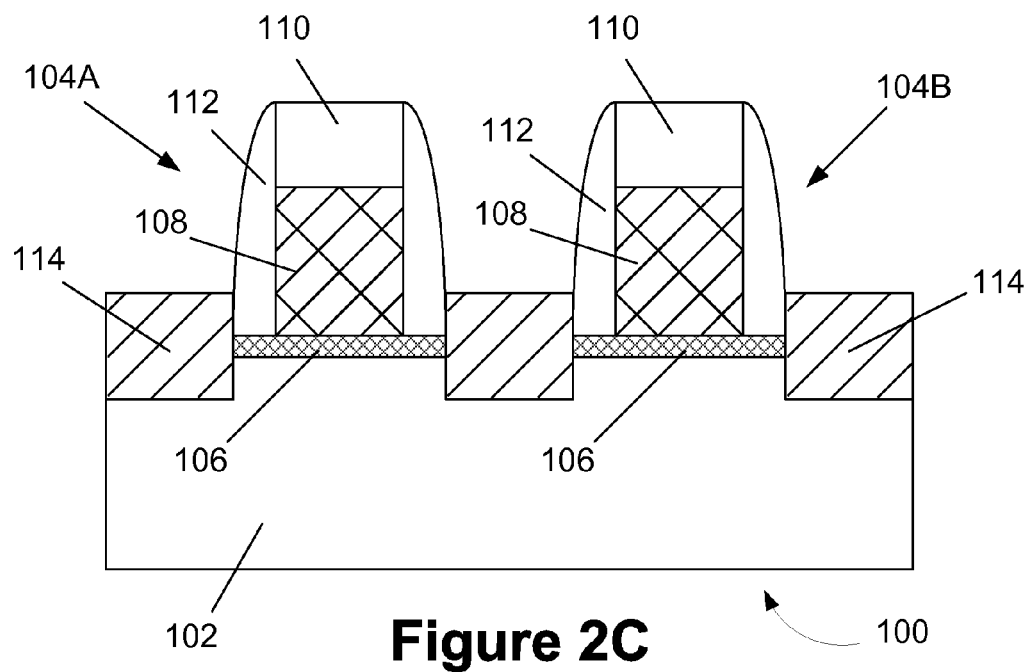

Next, as shown in FIG. 2C, various known process operations are performed to form illustrative raised source/drain regions 114 in the substrate 102 adjacent the sidewall spacer 112. However, such raised source/drain regions 114 need not be formed in all applications, and the disclosed inventions should not be considered to be limited to such an illustrative configuration. Initially, the exposed portions of the sacrificial gate insulation layer 106 are removed by performing an etching process. Then, the raised source/drain regions 114 may be formed by initially forming cavities in the substrate 102 and thereafter performing an epitaxial deposition process to thereby form doped semiconductor material in the cavities in the substrate 102. Although not depicted in the drawings, an extension implantation process may be performed to form extension implant regions (not shown) in the substrate 102 prior to or after the formation of the first sacrificial sidewall spacer 112.

Figure 2D:
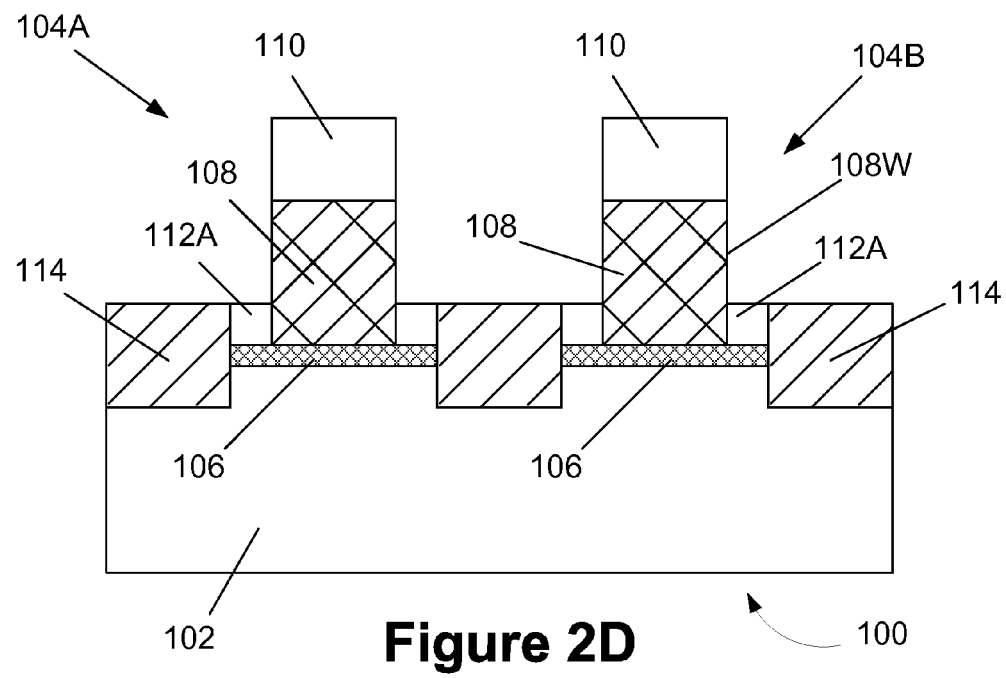

Next, as shown in FIG. 2D, a portion of the first sacrificial sidewall spacer 112 is removed by performing a wet or dry etching process that selectively removes a portion of the first sacrificial sidewall spacer 112 relative to surrounding structures. In one illustrative embodiment, the etching process that is performed to remove the first sacrificial sidewall spacer 112 exposes the sidewall 108W of the sacrificial gate electrodes 108. Note that the etching process is controlled such that a residual portion 112A of the first sacrificial sidewall spacer 112 remains positioned between the raised source/drain regions 114 and the sacrificial gate electrode 108.

Figure 2E:
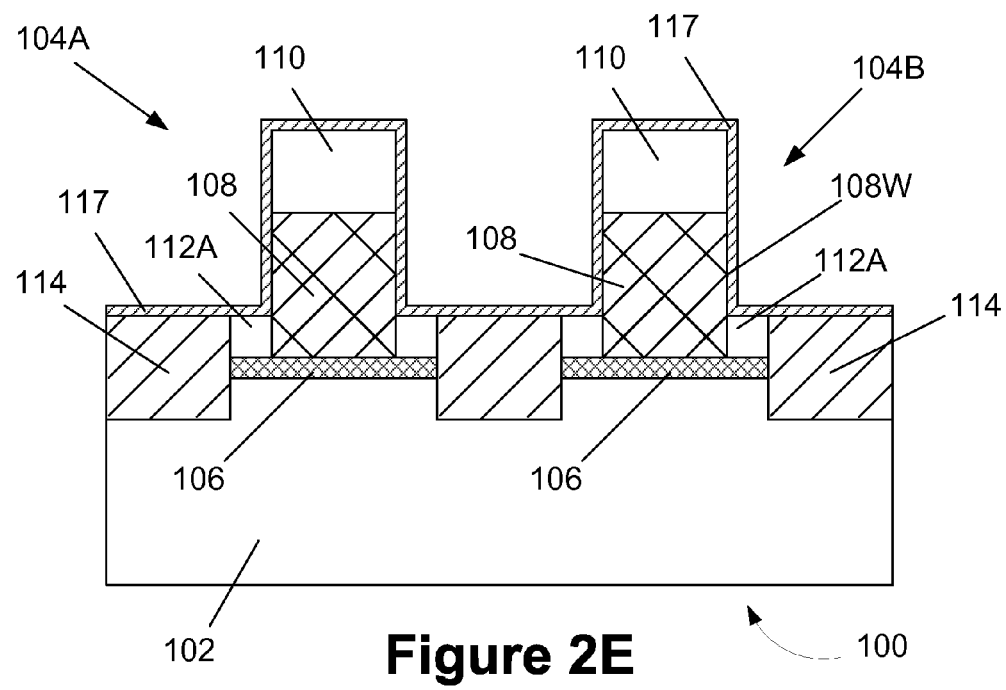

Next, as shown in FIG. 2E, a conformably deposited liner layer 117 that is comprised of an insulating material is formed on the device 100. In one illustrative embodiment, the liner layer 117 may have a thickness of about 2-5 nm and it may be deposited on, i.e., contact, the exposed sidewalls 108W of the sacrificial gate electrode 108, and may be formed by performing an ALD or CVD process. The liner layer 117 may be comprised of a variety of different insulating materials, e.g., silicon nitride, silicon oxynitride, silicon carbon boron nitride, etc.

Figure 2F:
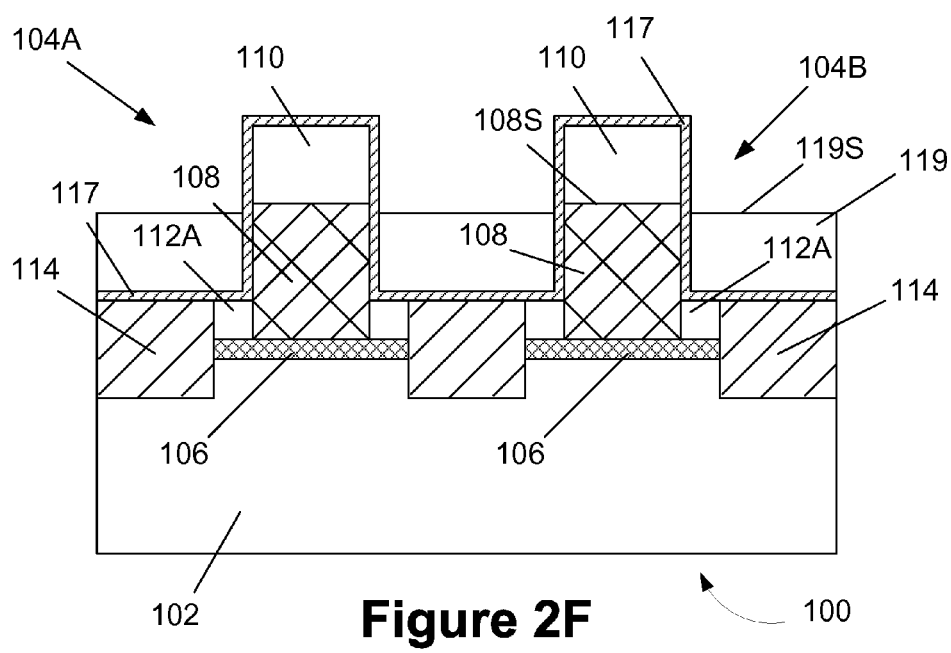

Then, as shown in FIG. 2F, a first layer of insulating material 119 is formed on the device 100. In one illustrative example, the layer of insulating material 119 may be a silicon dioxide material, such as a flowable oxide material, and it may be formed using traditional techniques, e.g., CVD, spin-on/cure, etc. At the point depicted in FIG. 2F, an etch-back process has been performed on the layer of insulating material 119 such that its upper surface 119S is at or near the same level as the upper surface 108S of the sacrificial gate electrode 108.

Figure 2G:
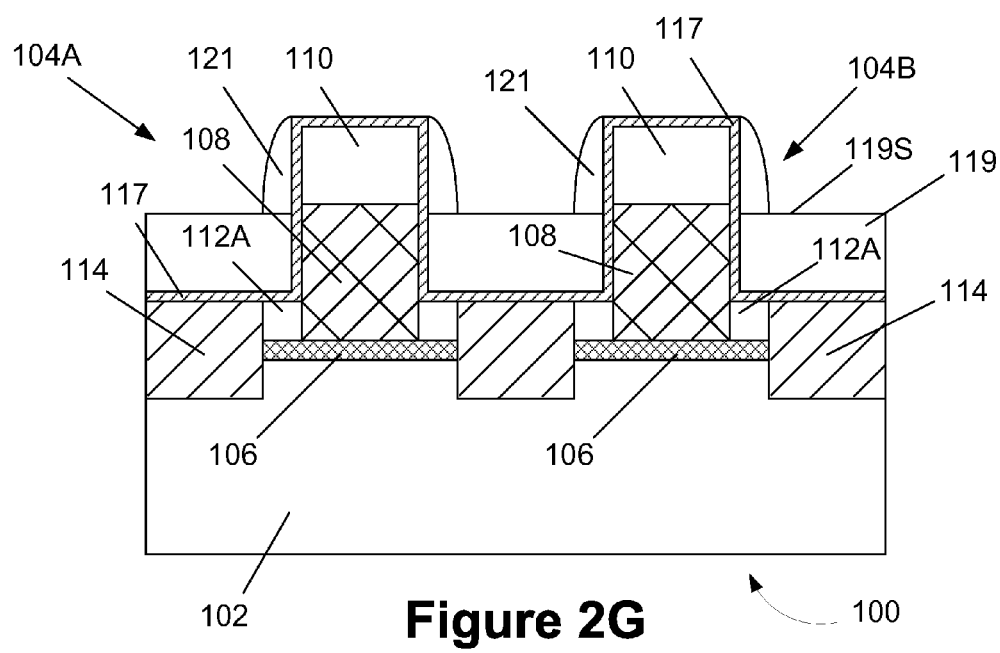

Next, as shown in FIG. 2G, a second sacrificial sidewall spacer 121 is formed above the layer of insulating material 119 and adjacent the liner layer 117. The second sacrificial sidewall spacer 121 may be formed by depositing a layer of spacer material and thereafter performing an anisotropic etching process. The second sacrificial sidewall spacer 121 may be comprised of the same materials as those mentioned above for the first sacrificial sidewall spacer 112. The base thickness of the second sacrificial sidewall spacer 121 may vary depending upon the particular application. In one illustrative embodiment, the second sacrificial sidewall spacer 121 may have a thickness at its base of about 7-12 nm.

Figure 2H:
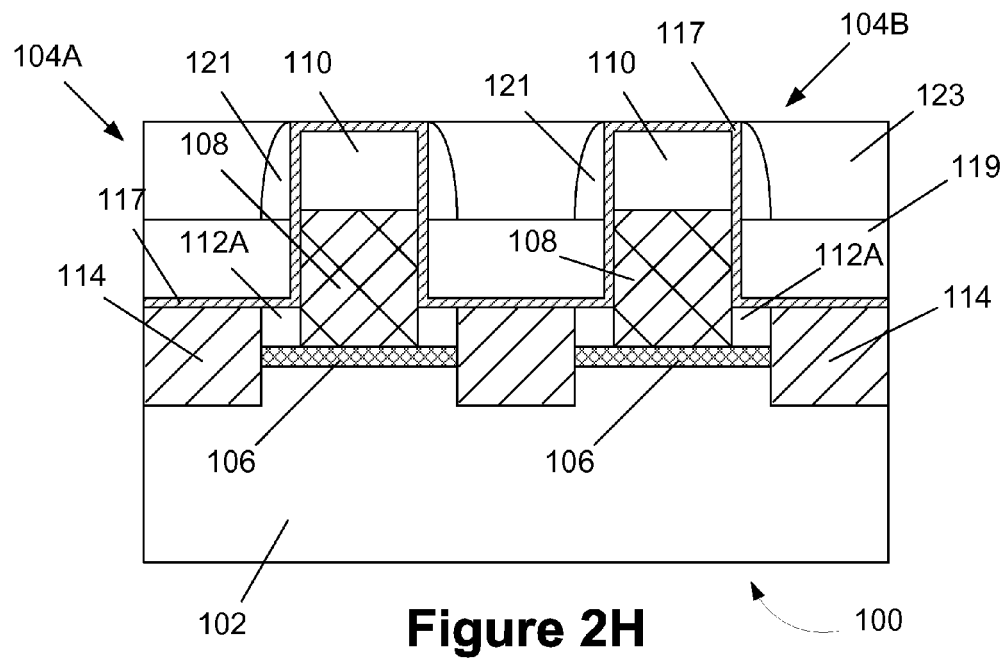

FIG. 2H depicts the device 100 after a second layer of insulating material 123, e.g., silicon dioxide, has been blanket-deposited above the device 100, and after one or more CMP processes have been performed on the insulating layer 123. The CMP process stops on the upper surface of the liner layer 117 or perhaps on the sacrificial gate cap layer 110, depending upon how aggressive the CMP process is performed.

Figure 2I:
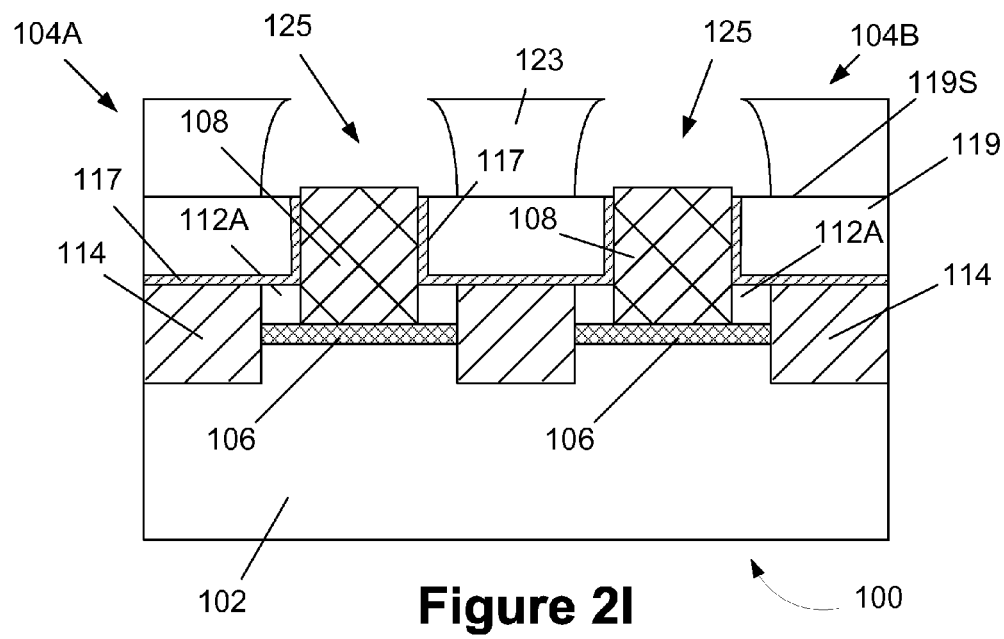

Next, as shown in FIG. 2I, one or more wet or dry etching processes are performed to remove the exposed portions of the liner layer 117, the sacrificial gate cap layer 110 and the second sacrificial sidewall spacers 121. This etching process defines a gate cap cavity 125 that is positioned above the sacrificial gate electrode 108 and exposes the gate electrode 108 so that it may be subsequently removed. Note that, even after this etching process is performed, portions of the liner layer 117 remain positioned between the layer of insulating material 119 and the sacrificial gate electrode 108.

Figure 2J:
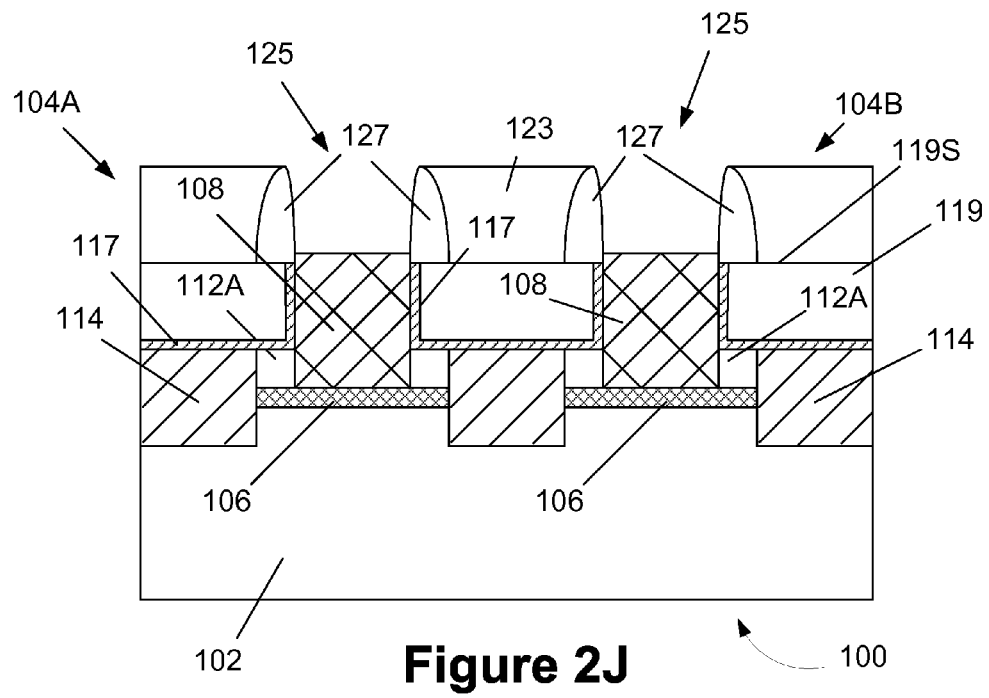

FIG. 2J depicts the device 100 after an inner, non-sacrificial, sidewall spacer 127 has been formed in the gate cap cavities 125 adjacent the layer of insulating material 123. The sidewall spacer 127 may be formed by conformably depositing a layer of spacer material and thereafter performing an anisotropic etching process. The sidewall spacer 127 may be comprised of a variety of different materials, e.g., silicon nitride, silicon oxynitride, etc., and it may be formed by performing an ALD or CVD process. The base thickness of the sidewall spacer 127 may vary depending upon the particular application. In one illustrative embodiment, the sidewall spacer 127 may have a base thickness of about 3-12 nm.

Figure 2K:
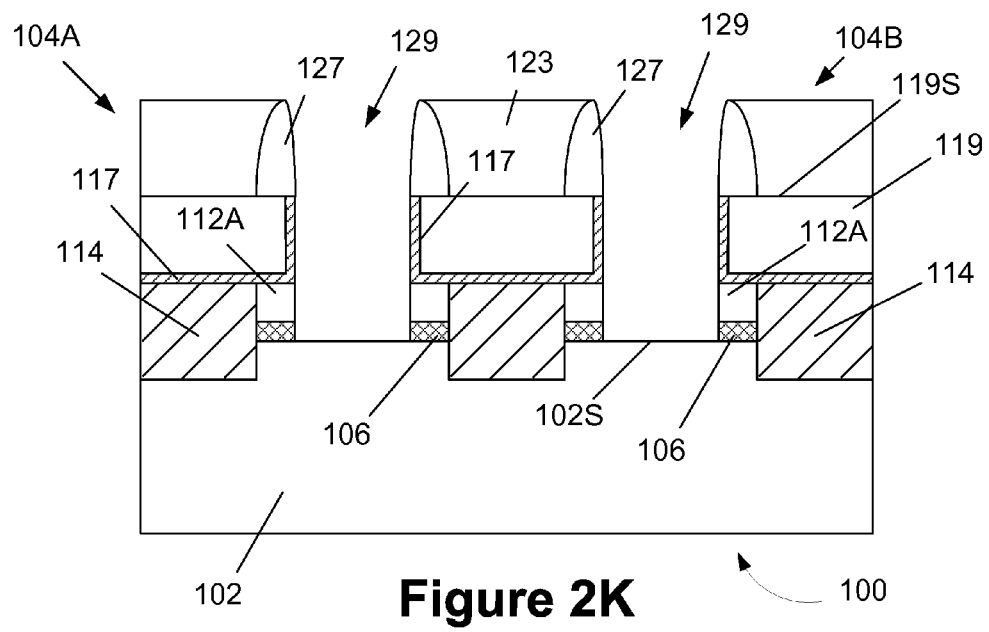
Figure 2L:
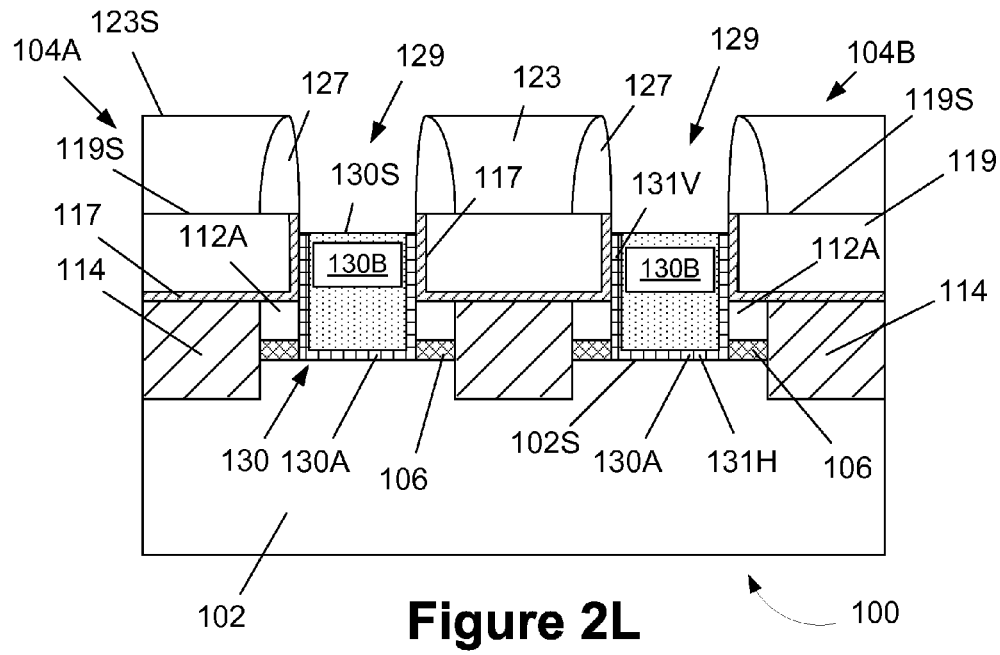

FIGS. 2K and 2L depict several process operations that are directed to the removal of the sacrificial gate electrode 108 and the sacrificial gate insulation layer 106, and the formation of a replacement gate structure 130 for the transistors 104A, 104B. As shown in FIG. 2K, one or more etching processes are performed through the gate cap cavity 125 (see FIG. 2J) to remove the sacrificial gate electrode 108 and portions of the sacrificial gate insulation layer 106 exposed by the removal of the sacrificial gate electrode 108. These etching processes define a gate cavity 129 where the replacement gate structure 130 will subsequently be formed. Note that the gate cavity 129 is at least partially laterally defined by the conformably deposited liner layer 117 at this point in the process flow. More specifically, the gate cavity 129 is laterally defined by remaining portions of the sacrificial gate insulation layer 106, the residual portions 112A of the first sacrificial sidewall spacers 112, the liner layer 117 and the spacers 127. A masking layer (not shown) that is typically used in such an etching process is not depicted for purposes of clarity. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavity 129.

As shown in FIG. 2L, schematically depicted replacement gate structures 130 for the transistors 104A, 104B are formed in the gate cavities 129. The schematically depicted gate structure 130 includes an illustrative gate insulation layer 130A and an illustrative gate electrode 130B. As will be recognized by those skilled in the art after a complete reading of the present application, the gate structure 130 of the device 100 depicted in the drawings, i.e., the gate insulation layer 130A and the gate electrode 130B, is intended to be representative in nature. For example, the gate insulation layer 130A may be comprised of a variety of different materials, such as, for example, silicon dioxide, a so-called high-k (k greater than 10) insulation material (where k is the relative dielectric constant), etc. The gate electrode 130B may be comprised of one or more layers of conductive material, e.g., polysilicon, one or more layers of metal, etc. As noted above, in some cases, if desired, a metal layer (not shown), such as a very thin work function adjusting metal (e.g., a layer of titanium nitride), may be formed on the high-k gate insulation layer 130A. As will be recognized by those skilled in the art after a complete reading of the present application, the insulating materials and the metal layer(s) that are part of the replacement gate structure 130 may be of any desired construction and comprised of any of a variety of different materials. Additionally, the replacement gate structure 130 for an NFET device may have different material combinations as compared to a replacement gate structure 130 for a PFET device. In such a case, appropriate masking layers (not shown) would be used to mask one of the devices while a different material of construction is formed on the unmasked device. Thus, the particular details of construction of replacement gate structure 130, and the manner in which such replacement gate electrode structure 130 is formed, should not be considered a limitation of the present invention unless such limitations are expressly recited in the attached claims.

In one illustrative example, the replacement gate formation process begins with performing a conformal deposition process to form the high-k gate insulation layer 130A in the gate cavities 129 and above the layer of insulating material 123. After a high temperature annealing process is performed to repair any defects in the high-k gate insulation layer 130A, the conductive materials that will be used for the gate electrode 130B, e.g., one or more metal layers, will be deposited across the devices by performing one or more conformal deposition processes and/or one or more blanket-deposition processes so as to substantially overfill the gate cavities 129 with conductive gate electrode material(s). At that point, one or more CMP processes are performed to remove excess portions of the gate insulation layer 130A and the layers of conductive material that will be used to form the gate electrode 130B positioned above the layer of insulating material 123. This CMP process essentially planarizes the upper surface of the materials of the gate structure 130 with the upper surface 123S of the layer of insulating material 123. Thereafter, an etching process is performed to reduce the height of the replacement gate structure 130 such that the upper surface 130S of the replacement gate electrode 130B is positioned below the upper surface 123S of the layer of insulating material 123. These process operations result in the structure depicted in FIG. 2L. Note that, in the depicted example, the gate insulation layer 130A has a generally "U" shaped configuration with a substantially horizontal portion 131H (that contacts the substrate 102) and two upstanding vertically oriented (relative to the surface of the substrate 102) portions 131V. In the depicted example, the inside surface of the liner layer 117 engages the vertically oriented portions 131V of the gate insulation layer 130A along less than the entire length (in the vertical direction normal to the surface of the substrate 102) of the vertical portions 131V of the gate insulation layer 130A. Also note that the residual portion 112A of the sidewall spacers 112 and the residual portions of the sacrificial gate insulation layer 106 engage some of the vertical portions 131V of the gate insulation layer 130A.

Figure 2M:
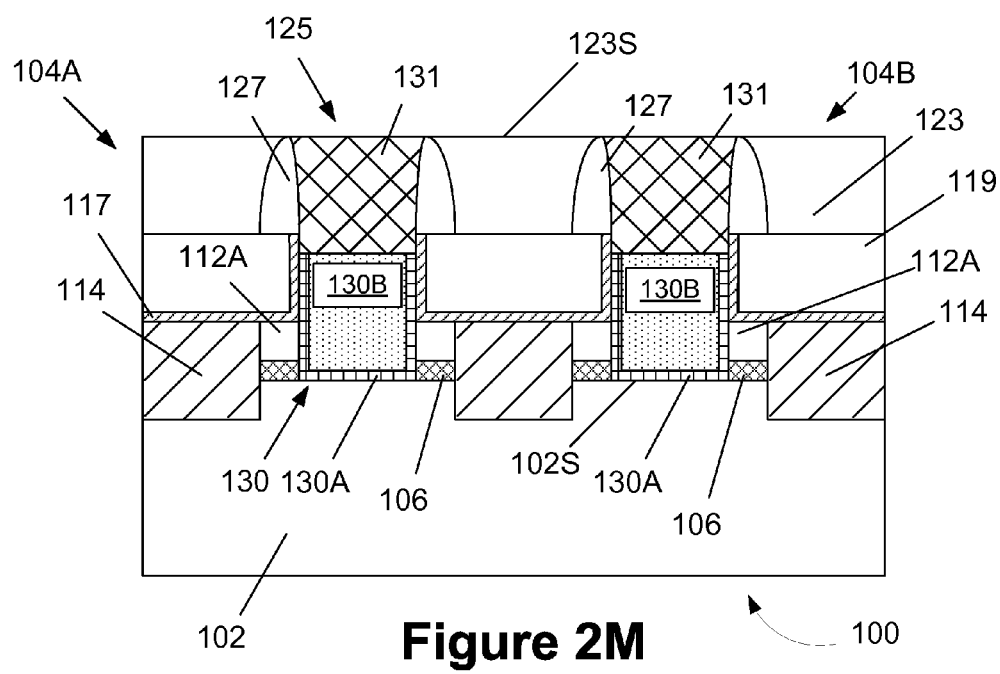

Next, as shown in FIG. 2M, an illustrative final gate cap layer 131 comprised of, for example, silicon nitride, silicon-carbon-nitride (SiCN) or silicon-carbon-boron-nitride (SiCBN), has been formed in the gate cap cavity 125 above the recessed gate structure 130. The final gate cap layer 131 may be formed by depositing a layer of the cap material and thereafter performing a CMP process to remove excess portions of the cap material positioned above the surface 123S of the layer of insulating material 123.

Figure 2N:
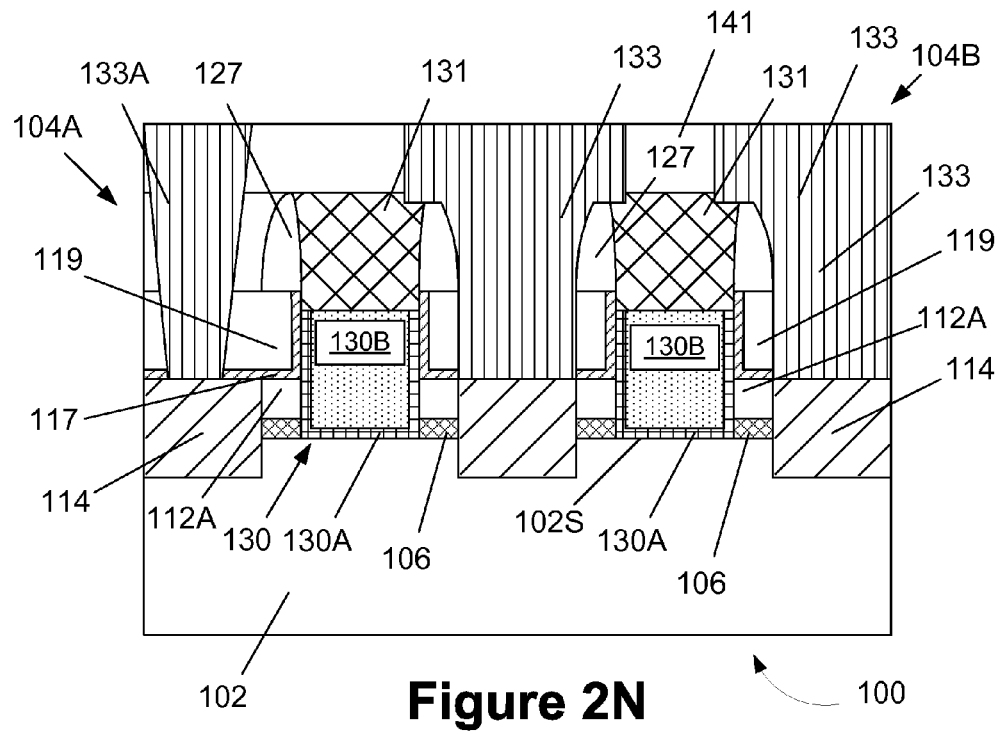

FIG. 2N depicts the device 100 after several process operations have been performed using one particular process flow disclosed herein. First, a third layer of insulating material 141, e.g., silicon dioxide was formed above the device. Thereafter, a plurality of illustrative conductive contacts were formed to establish electrical communication with the source/drain regions 114. More specifically, a plurality of self-aligned contacts 133 and an illustrative standard contact 133A are depicted as being formed on the device 100. The self-aligned contacts 133 are typically formed on devices with a very tight gate pitch, whereas the standard contact 133A may be formed on devices that have a more relaxed gate pitch. The manner in which such contacts 133, 133A are formed are well known to those skilled in the art. The size and shape of the contacts 133, 133A, as well as the conductive materials used to form the contacts 133, 133A, may vary depending upon the particular device under construction. In general, any conductive material, or combinations of conductive materials, e.g., metals, metal alloys, metal silicide materials, etc., may be used for the contacts 133, 133A. Thus, such details associated with the formation of the contacts 133, 133A should not be considered to be limitations of the present disclosed inventions. Note that, in this illustrative process flow, metal silicide regions may be formed on the source/drain regions 114 after the point of fabrication depicted in FIG. 2C, or later in the process flow as part of the process of forming the contacts 133, 133A.

Figure 2O:
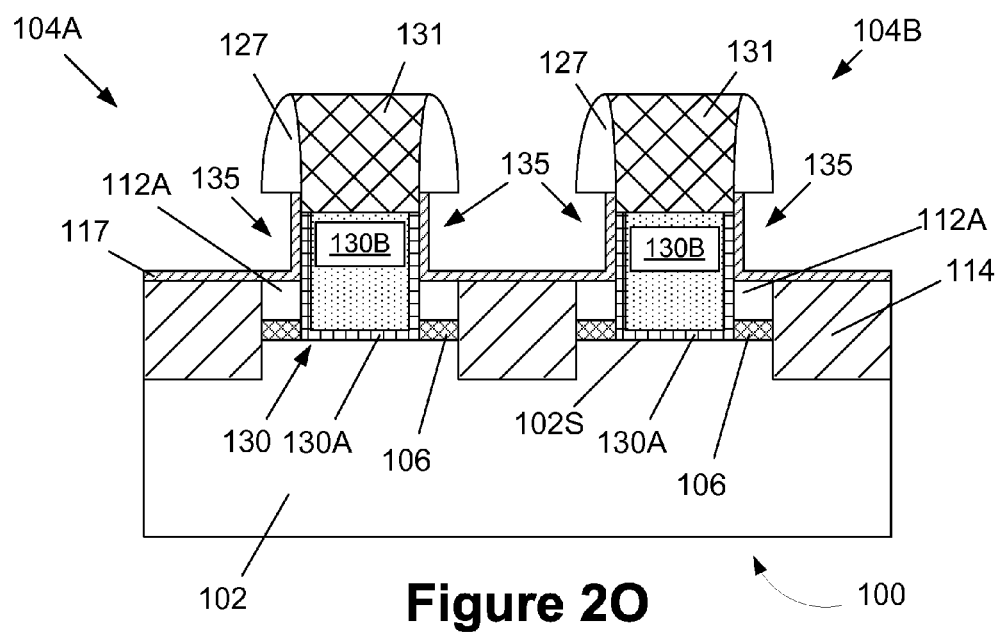

FIG. 2O-2R depict another illustrative process flow disclosed herein. Beginning with the structure shown in FIG. 2M, instead of immediately forming the self-aligned contacts 133 (as shown in FIG. 2N), low-k sidewall spacers are formed on the device. As shown in FIG. 2O, starting with the structure depicted in FIG. 2M, one or more wet or dry etching processes are performed to remove the layers of insulating material 123, 119 to thereby define a recess 135 positioned under the sidewall spacer 127 and adjacent the liner layer 117.

Figure 2P:
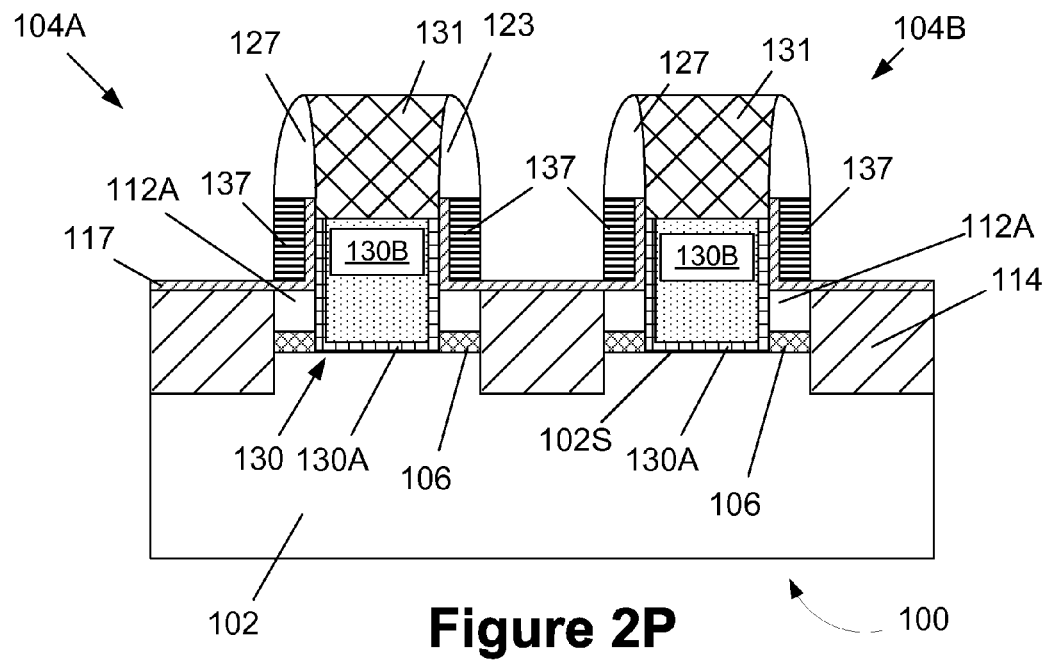

Next, as shown in FIG. 2P, low-k sidewall spacers 137 are formed adjacent the gate structures 130 of the transistors 104A, 104B. More specifically, the low-k sidewall spacers 137 are formed in the recess 135 under the sidewall spacers 127 on the liner layer 117. The low-k sidewall spacers 137 may be formed by depositing a layer of low-k (k-value less than 6) insulating material and thereafter performing an anisotropic etching process. Illustrative examples of such low-k materials are silicon-carbon-nitride (SiCN), silicon-carbon-boron-nitride (SiCBN), silicon dioxide, a porous silicon dioxide, etc. The base thickness of the low-k sidewall spacers 137 may vary depending upon the particular application and will be determined by the lateral width of the recess 135 that is essentially defined by the base thickness of the spacer 127. In one illustrative embodiment, the low-k sidewall spacers 137 may have a thickness at its base of about 3-12 nm.

Figure 2Q:
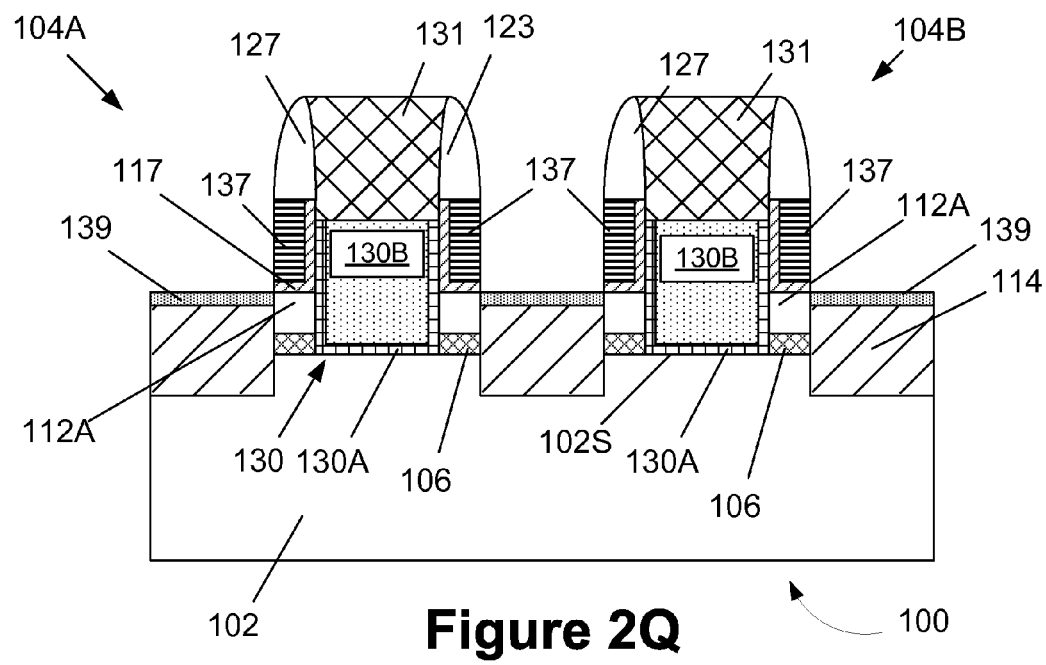

FIG. 2Q depicts the device 100 after illustrative metal silicide regions 139 have been formed on the raised source/drain regions 114. In a field effect transistor, metal silicide regions are typically formed in the source/drain regions of a transistor to reduce the resistance when a conductive contact is formed to establish electrical connection to the source/drain regions. The metal silicide regions 139 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal on the source/drain region; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art.

Figure 2R:
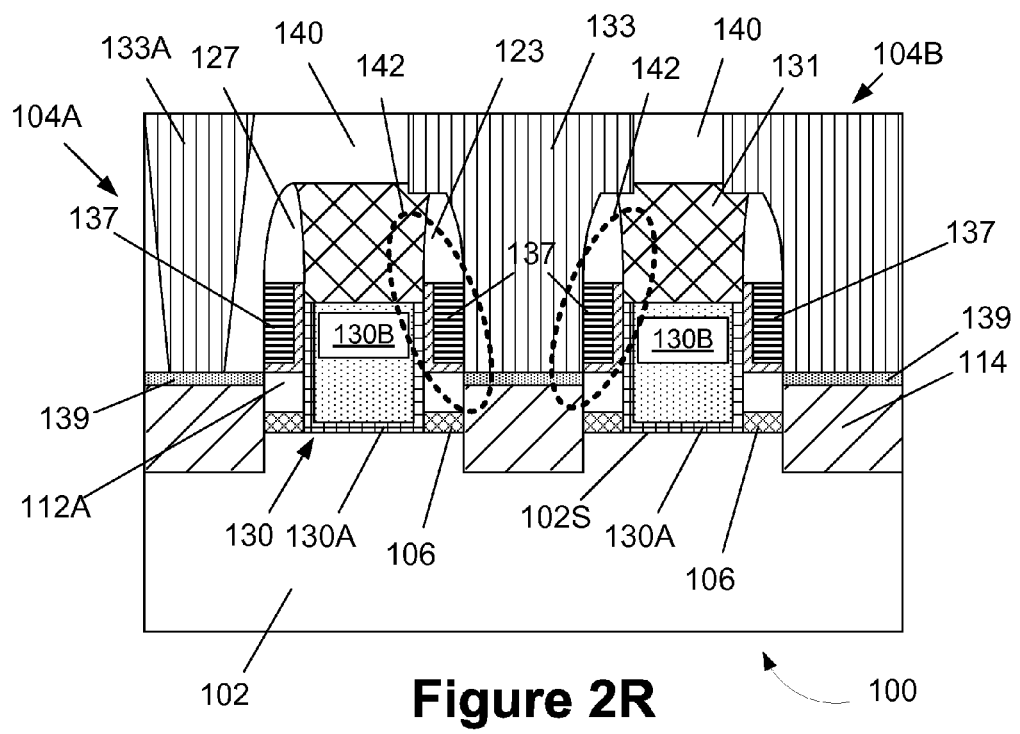

FIG. 2R depicts the device 100 after several process operations have been performed. First, a layer of insulating material 140, e.g., silicon dioxide, has been formed above the device 100, and a plurality of the previously described contacts 133, 133A have been formed to establish electrical communication with the source/drain regions 114.

As will be appreciated by those skilled in the art after a complete reading of the present application, the methods and devices disclosed herein provide an advantage as it relates to the semiconductor devices generally described in the background section of this application. More specifically, due to the use of the low-k spacers 137 with the novel devices disclosed herein, the capacitance of the gate-to-contact capacitor in the area generally indicated by the dashed lines 142 may be less than the corresponding gate-to-contact capacitor in the prior art device 10 depicted in FIG. 1E. Accordingly, the devices disclosed herein may operate at faster switching speeds as it will take less time for the novel devices disclosed herein to charge and discharge the gate-to-contact capacitor each time the transistor is turned on-off.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a sacrificial gate structure and a sacrificial gate cap layer above a semiconducting substrate, said sacrificial gate structure comprising at least a sacrificial gate electrode that has a plurality of sidewalls;
   forming at least one first sacrificial sidewall spacer adjacent said sacrificial gate electrode;
   performing at least one etching process to remove a portion of said first sacrificial sidewall spacer and thereby expose at least a portion of said sidewalls of said sacrificial gate electrode;
   after performing said etching process, forming a liner layer on said exposed sidewalls of said sacrificial gate electrode and above a residual portion of said first sacrificial sidewall spacer;
   forming a first layer of insulating material above said liner layer;
   forming at least one second sacrificial sidewall spacer above said first layer of insulating material and adjacent said liner layer;
   forming a second layer of insulating material adjacent said second sacrificial sidewall spacer;
   performing at least one etching process to remove at least said second sacrificial sidewall spacer and said sacrificial gate cap layer to thereby define an opening in said second layer of insulating material that exposes an upper surface of said sacrificial gate electrode;
   after exposing said upper surface of said sacrificial gate electrode, removing at least said sacrificial gate electrode to thereby define a gate cavity that is at least partially defined laterally by said liner layer; and
   forming a replacement gate structure in said gate cavity.

2. The method of claim 1, wherein said liner layer is comprised of silicon nitride or silicon oxynitride.

3. The method of claim 1, wherein said first and second layers of insulating material are comprised of silicon dioxide.

4. The method of claim 1, wherein said sacrificial gate structure is comprised of a silicon dioxide gate insulation layer and a polysilicon gate electrode positioned above said gate insulation layer.

5. The method of claim 1, wherein said replacement gate structure comprises a gate insulation layer comprised of a high-k insulating material and a gate electrode comprised of at least one layer of metal.

6. The method of claim 1, wherein said step of removing at least said sacrificial gate electrode comprises performing at least one etching process to remove at least said sacrificial gate electrode.

7. The method of claim 1, further comprising forming a non-sacrificial sidewall spacer within said opening in said second layer of insulating material, said non-sacrificial sidewall spacer defining a gate cap cavity within said second layer of insulating material above said replacement gate structure.

8. The method of claim 7, further comprising forming a final gate cap layer in said gate cap cavity above said replacement gate structure.

9. The method of claim 8, further comprising:
   after forming said final gate cap layer, forming a third layer of insulating material above said final gate cap layer;
   forming a contact opening in said first, second and third layers of insulating material that exposes a source/drain region formed in said substrate proximate said replacement gate structure; and
   forming a self-aligned contact in said contact opening that is conductively coupled to said source/drain region.

10. The method of claim 8, further comprising:
    performing at least one etching process to remove at least said first and second layers of insulating material, which thereby defines a recess under said non-sacrificial sidewall spacer; and
    forming a low-k sidewall spacer that is at least partially positioned within said recess under said non-sacrificial spacer and adjacent said liner layer.

11. The method of claim 10, wherein said step of forming said low-k spacer in said recess and adjacent said liner layer comprises:
    depositing a layer of low-k insulating material above said final gate cap, said non-sacrificial sidewall spacers and in said recess on said liner layer; and
    performing an anisotropic etching process on said layer of low-k insulating material.

12. The method of claim 1, further comprising forming metal silicide regions on source/drain regions formed in said substrate adjacent said replacement gate structure.

13. The method of claim 12, further comprising:
    forming a third layer of insulating material above said substrate and said metal silicide regions;
    forming a plurality of contact openings in said first, second and third layers of insulating material that exposes said metal silicide regions; and
    forming a self-aligned contact in each of said contact openings that is conductively coupled to one of said metal silicide regions.

* * * * *